(12) United States Patent
Arik et al.

(10) Patent No.: US 7,688,583 B1
(45) Date of Patent: Mar. 30, 2010

(54) SYNTHETIC JET AND METHOD OF MAKING SAME

(75) Inventors: Mehmet Arik, Niskayuna, NY (US); Yogen Vishwas Utturkar, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 14 days.

(21) Appl. No.: 12/241,138

(22) Filed: Sep. 30, 2008

(51) Int. Cl.
 *H05K 7/20* (2006.01)
(52) U.S. Cl. .................. 361/694; 361/689; 361/690; 361/692; 361/695; 174/16.1; 165/104.28; 165/104.33
(58) Field of Classification Search .................. None
See application file for complete search history.

(56) References Cited

U.S. PATENT DOCUMENTS

| | | | |
|---|---|---|---|
| 5,758,823 A | 6/1998 | Glezer et al. | |
| 5,894,990 A | 4/1999 | Glezer et al. | |
| 5,988,522 A | 11/1999 | Glezer et al. | |
| 6,056,204 A | 5/2000 | Glezer et al. | |
| 6,123,145 A | 9/2000 | Glezer et al. | |
| 6,603,658 B2* | 8/2003 | Manno et al. | 361/679.48 |
| 6,722,581 B2 | 4/2004 | Saddoughi | |
| 6,801,430 B1 | 10/2004 | Pokharna | |
| 7,251,139 B2* | 7/2007 | Bhattacharya et al. | 361/719 |
| 7,263,837 B2 | 9/2007 | Smith | |
| 7,307,841 B2* | 12/2007 | Berlin et al. | 361/699 |
| 7,336,486 B2* | 2/2008 | Mongia | 361/695 |
| 7,362,574 B2* | 4/2008 | Campbell et al. | 361/699 |
| 7,450,381 B2* | 11/2008 | Gilliland et al. | 361/695 |
| 2007/0076370 A1* | 4/2007 | Mongia et al. | 361/690 |
| 2009/0219686 A1* | 9/2009 | Ishikawa et al. | 361/692 |

OTHER PUBLICATIONS

Arik, "An investigation into feasibility of impingement heat transfer and acoustic abatement of meso scale synthetic jets," Applied Thermal Engineering, 2007, vol. 27, pp. 1483-1494.
Utturkar et al., "An Experimental and Computational Heat Transfer Study of Pulsating Jets," Journal of Heat Transfer, Jun. 2008, vol. 130.
Garg et al., "Meso Scale Pulsating Jets for Electronics Cooling".

* cited by examiner

*Primary Examiner*—Boris L Chervinsky
(74) *Attorney, Agent, or Firm*—Ziolkowski Patent Solutions Group, SC; Jean K. Testa

(57) ABSTRACT

A synthetic jet includes an inner wall configured to surround a heat-generating component, a plurality of walls coupled to the inner wall, the inner wall and the plurality of walls configured to enclose a volume surrounding the inner wall, an actuator coupled to one of the plurality of walls and the inner wall. The inner wall has a plurality of orifices formed therein configured to direct a fluid toward the heat-generating component upon activation of the actuator.

20 Claims, 4 Drawing Sheets

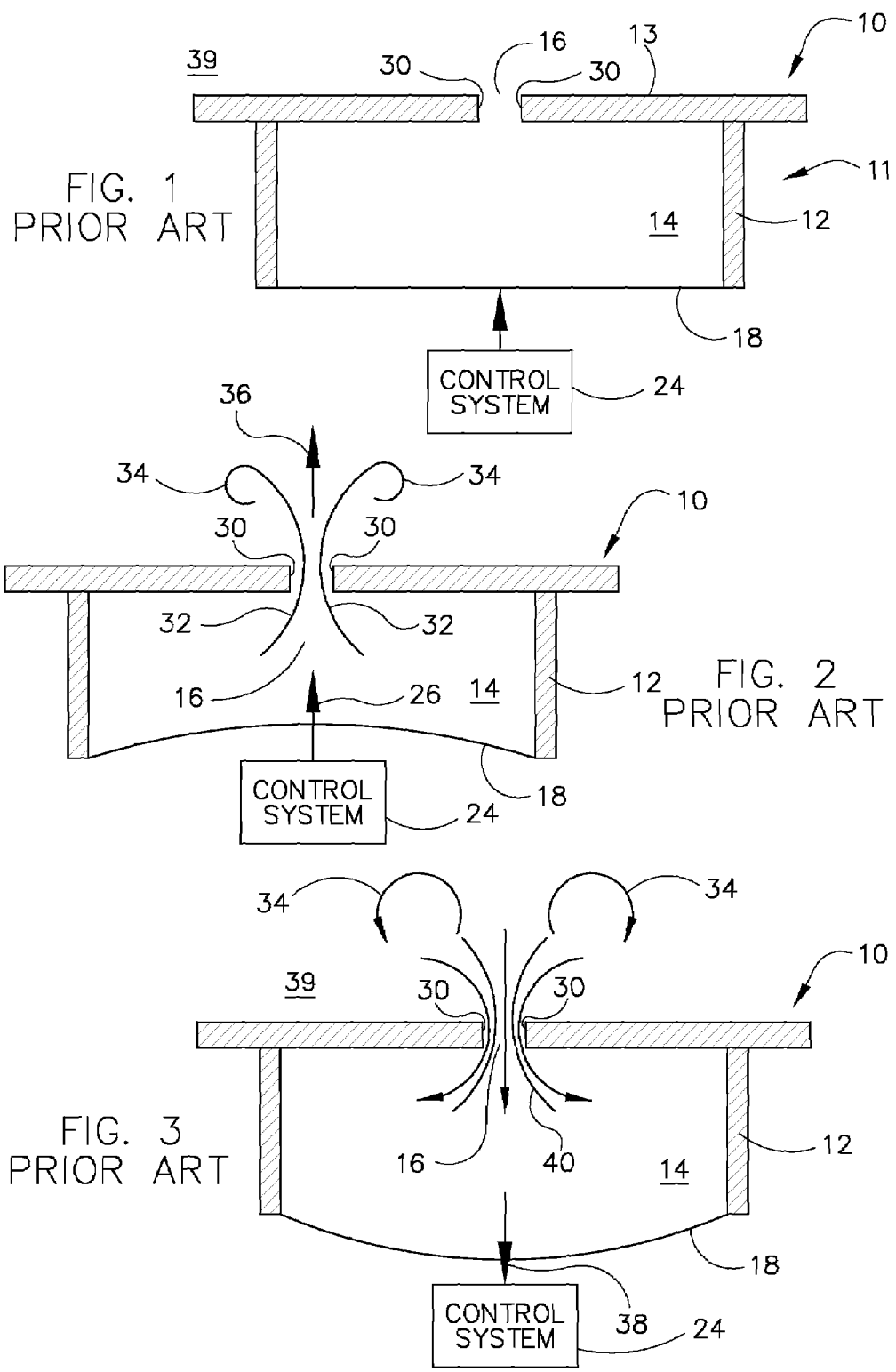

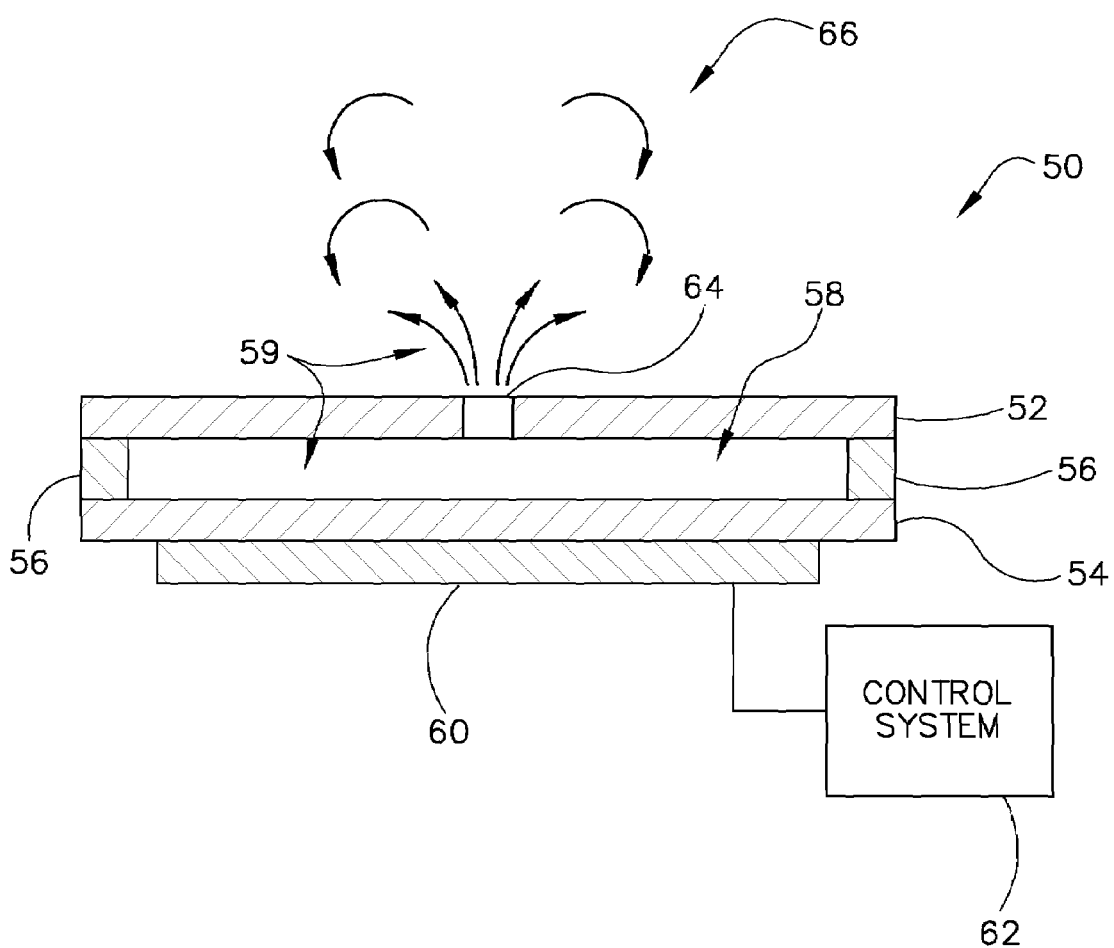

SYNTHETIC JET AND METHOD OF MAKING SAME

BACKGROUND OF THE INVENTION

The invention relates generally to synthetic jets and, more particularly, to a method and apparatus of acoustic noise reduction therein.

A synthetic jet may influence the flow over a surface to control flow, as in, for example, separation from an airfoil, or to enhance convection on a surface. A typical synthetic jet actuator includes a housing defining an internal chamber, and an orifice is present in a wall of the housing. The actuator further includes a mechanism in or about the housing for periodically changing the volume within the internal chamber so that a series of fluid vortices are generated and projected in an external environment out from the orifice of the housing. Various volume changing mechanisms include, for example, a piston positioned in the jet housing to move so that gas or fluid is moved in and out of the orifice during reciprocation of the piston and a flexible diaphragm as a wall of the housing. The flexible diaphragm is typically actuated by a piezoelectric actuator or other appropriate means.

Typically, a control system is utilized to create time-harmonic motion of the diaphragm. As the diaphragm moves into the chamber, decreasing the chamber volume, fluid is ejected from the chamber through the orifice. As the fluid passes through the orifice, the flow separates at the sharp edges of the orifice and creates vortex sheets, which roll up into vortices. These vortices move away from the edges of the orifice under their own self-induced velocity. As the diaphragm moves outward with respect to the chamber, increasing the chamber volume, ambient fluid is drawn from large distances from the orifice into the chamber. Because the exiting vortices are already removed from the edges of the orifice, they are not affected by the ambient fluid being entrained into the chamber. Thus, as the vortices travel away from the orifice, they synthesize a jet of fluid, thus called a "synthetic jet," through entrainment of the ambient fluid.

A synthetic jet may be used for thermal management of tight spaces where electronics may be housed and where space for the electronics is a premium. Typically, wireless communication devices such as cellular phones, pagers, two-way radios, and the like, have much of their heat generated in IC packages that are positioned in such tight spaces. Because of the limited space and limited natural convection therein, the heat generated is typically conducted into printed circuit boards and then transferred to the housing interior walls via conduction, convection, and radiative processes. The heat is then typically conducted through the housing walls and to the surrounding ambient environment. The process is typically limited because of the limited opportunity for convection cooling within the housing and over the printed circuit boards. The low thermal conductivity of the fiberglass epoxy resin-based printed circuit boards can lead to high thermal resistance between the heat source and the ambient environment. And, with the advent of smaller enclosures, higher digital clock speeds, greater numbers of power-emitting devices, higher power-density components, and increased expectations for reliability, thermal management issues present an increasing challenge in microelectronics applications.

To improve the heat transfer path, micro/meso scale devices such as synthetic jets have been proposed as a possible replacement for or augmentation of natural convection in microelectronics devices. Applications may include impingement of a fluid in and around the electronics and printed circuit boards. In some applications, cooling opportunities using synthetic jets may be limited because of excess power density in a small device such as a reflector in a lighting application. Because of the limited space and concentrated power density, such applications may benefit by having multiple synthetic jets directed thereto. Furthermore, in other applications, distributed heat sources may be tightly packed and each may benefit from one or more synthetic jets directed thereto. However, in such applications, space limitations may preclude placement and use of conventional synthetic jets. Such applications may include electronics components mounted and distributed on a surface of a printed circuit board, as an example. Likewise, in other applications the heated source may be non-planar and complex/curvaceous in shape leading to a non-optimal heat transfer performance with the use of conventional synthetic jets.

Further, a synthetic jet may produce undesirable levels of acoustic noise during operation. A synthetic jet typically has two natural frequencies at which the synthetic jet yields an optimum cooling performance. These natural frequencies include the structural resonant frequency and the acoustic resonance—the Helmholtz—frequency. The structural resonant frequency is caused at the natural frequency of the structure of the synthetic jet, which consists typically of the synthetic jet plates acting as a mass and the elastomeric wall acting as a spring. The Helmholtz frequency is characterized by the acoustic resonance of air mass in and out of the orifice of the synthetic jet. The effect is due to the air in the synthetic jet volume acting as a spring and may be accompanied by a loud tonal noise and a determined vibrational mode if the two modes are not separated from one another in the frequency domain. Thus, the process of operating a synthetic jet typically results in an acoustically loud noise that may limit or preclude its use in cooling and other applications.

Therefore, it would be desirable to design an apparatus and method for reducing acoustic noise in a synthetic jet while enhancing convection of electronics component devices having high power density and multiple components distributed throughout a tightly packed space.

BRIEF DESCRIPTION OF THE INVENTION

Embodiments of the invention provide a method and apparatus that overcome the aforementioned drawbacks. Embodiments of the invention are directed method and apparatus for cooling one or more electronic components using a synthetic jet.

According to one aspect of the invention, a synthetic jet includes an inner wall configured to surround a heat-generating component, a plurality of walls coupled to the inner wall, the inner wall and the plurality of walls configured to enclose a volume surrounding the inner wall, an actuator coupled to one of the plurality of walls and the inner wall. The inner wall has a plurality of orifices formed therein configured to direct a fluid toward the heat-generating component upon activation of the actuator.

In accordance with another aspect of the invention, a method of fabricating a synthetic jet includes forming a synthetic jet comprising an inner wall and having an interior volume configured to encircle the inner wall, wherein the inner wall is configured to encircle an exterior volume, attaching a micromechanical device to the synthetic jet, and forming a plurality of apertures through the inner wall such that fluid passing therethrough from the interior volume is directed toward the exterior volume via activation of the micromechanical device.

Yet another aspect of the invention includes a system for cooling a device that includes a component and a synthetic jet. The synthetic jet includes a top surface having an unbroken inner perimeter and an unbroken outer perimeter and a bottom surface having an unbroken inner perimeter and an unbroken outer perimeter. The synthetic jet also includes an inner wall coupled to the inner perimeter of the top surface and the inner perimeter of the bottom surface, the inner wall configured to encircle the component, and an outer wall coupled to the outer perimeter of the top surface and the outer perimeter of the bottom surface, and configured to form an enclosure between the top surface, the bottom surface, the inner wall, and the outer wall. An actuator is coupled to one of the walls and surfaces and configured to vary an internal volume of the enclosure. One of the walls and surfaces has at least one orifice formed therethrough, the at least one orifice fluidically coupled to the enclosure and fluidically coupled to an environment external to the enclosure. The at least one orifice is positioned to direct fluid passing therethrough toward the component.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 1 is a cross-section of a prior art zero net mass flux synthetic jet actuator with a control system.

FIG. 2 is a cross-section of the synthetic jet actuator of FIG. 1 depicting the jet as the control system causes the diaphragm to travel inward, toward the orifice.

FIG. 3 is a cross-section of the synthetic jet actuator of FIG. 1 depicting the jet as the control system causes the diaphragm to travel outward, away from the orifice.

FIG. 4 is an illustration of a cross-section of a synthetic jet.

DETAILED DESCRIPTION OF THE PREFERRED EMBODIMENT

Figure 5:
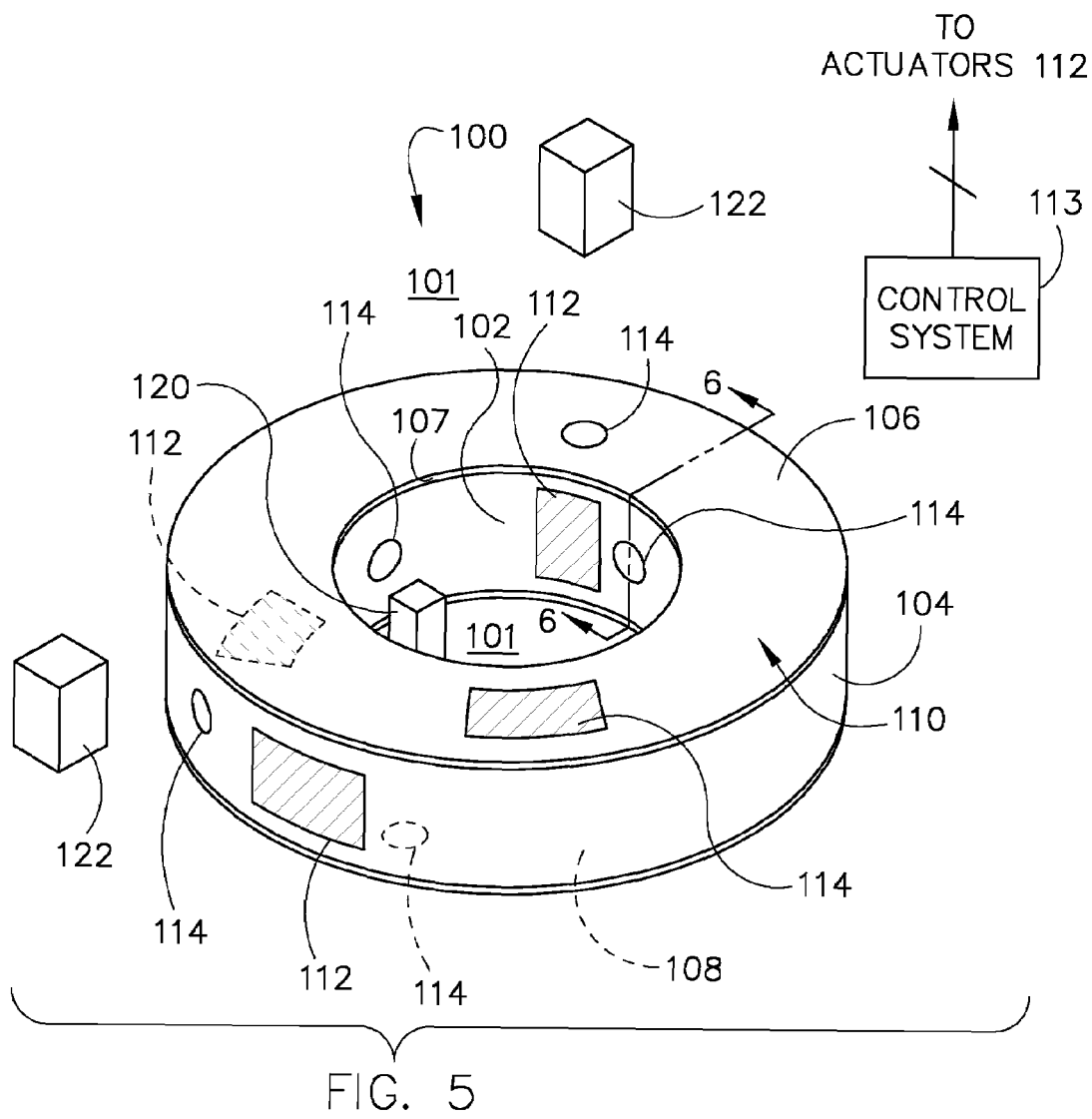
FIG. 5 is an illustration of a synthetic jet according to an embodiment of the invention.

Embodiments of the invention relate to a piezoelectric motive device and methods of making and using a piezoelectric motive device to reduce the acoustic noise emitting therefrom. The operating environment is described with respect to a thermal management system for enhancing convection in cooling of electronics. However, it will be appreciated by those skilled in the art that embodiments of the invention are equally applicable for use with other synthetic jet applications. For instance, synthetic jets have been routinely used for stand-point flow control, thrust vectoring of jets, triggering turbulence in boundary layers, and other heat transfer applications. Heat transfer applications may include direct impingement of vortex dipoles on heated surfaces and employing synthetic jets to enhance the performance of existing cooling circuits. Thus, although embodiments of the invention are described with respect to cooling of electronics, they are equally applicable to systems and applications using synthetic jets for other purposes.

Referring to FIGS. 1-3, a synthetic jet actuator 10 as known in the art, and the operation thereof, is shown. The synthetic jet actuator 10 includes a housing 11 defining and enclosing an internal chamber 14. The housing 11 and chamber 14 can take virtually any geometric configuration, but for purposes of discussion and understanding, the housing 11 is shown in cross-section in FIG. 1 to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16. Alternatively, a piezoelectric actuator could be attached to the diaphragm 18. The control system would, in that case, cause the piezoelectric actuator to vibrate and thereby move the diaphragm 18 in time-harmonic motion.

The operation of the synthetic jet actuator 10 is described with reference to FIGS. 2 and 3. FIG. 2 depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

FIG. 3 depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

FIG. 4 illustrates a cross-section of one embodiment of a synthetic jet 50 known in the art. Synthetic jet 50 includes first and second plates 52, 54 separated by a wall 56. A cavity 58 having a gas or fluid 59 therein is encircled by first and second plates 52, 54 and wall 56. A piezoelectric motive device 60 is coupled to second plate 54 and is controlled by a control system 62. An orifice 64 is positioned in first plate 52. During operation, control system 62 causes actuator 60 to move periodically in a time-harmonic motion, thus forcing fluid 59 in and out of cavity 58 through orifice 64, causing a jet 66 to emit therefrom.

FIG. 5 illustrates a toroid- or circular-shaped synthetic jet 100 according to an embodiment of the invention. In this embodiment, synthetic jet 100 includes an unbroken, or continuous inner bounding surface or wall 102 and an unbroken, or continuous outer bounding surface or wall 104, both having generally cylindrical profiles. The inner surface 102 and the outer surface 104 are joined together via a top surface or wall 106 and a bottom surface or wall 108. Thus, a generally toroid-shaped jet 100 is formed having an enclosed volume, enclosure or cavity 110 that is separate from the environment 101 external to the volume 110. Synthetic jet 100 includes actuators or piezoelectric motive devices 112 and orifices 114 that may be positioned on any or all surfaces 102, 104, 106, 108. Additional details of synthetic jet 100 will be described further below.

Figure 6:
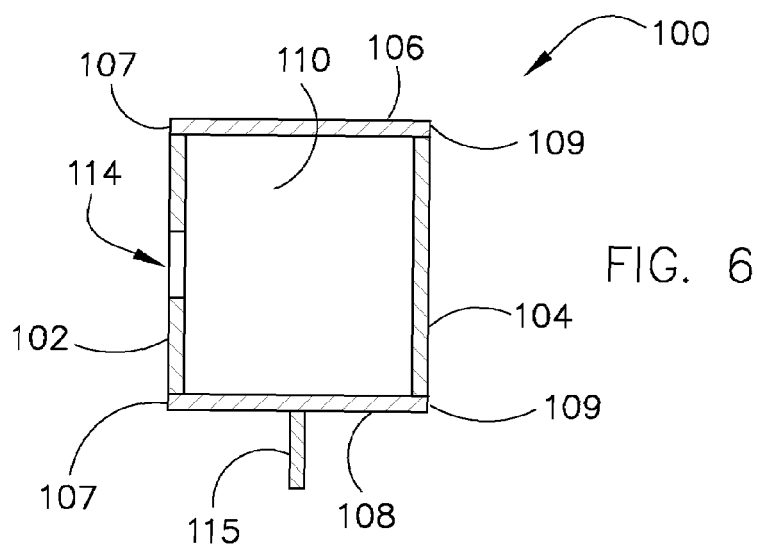
FIG. 6 is a cross-section of the synthetic jet of FIG. 5.

FIG. 6 illustrates a cross-sectional view of a portion of synthetic jet 100. In this view, and as described with respect to FIG. 5, inner and outer walls or surfaces 102, 104, coupled to top and bottom surfaces 106, 108, enclose a volume 110. Orifice 114 passes through surface 102. Thus, referring to FIGS. 5 and 6, top and bottom surfaces 106, 108 include continuous inner boundaries 107 that are positioned to encircle or enclose components, such as one or more components 120. Top and bottom surfaces 106, 108 include continuous outer boundaries 109 that are configured to encircle inner boundaries 107. Synthetic jet 100 may include a stand-off 115 that enables the jet 100 to be positioned at a distance from a surface on which jet 100 is placed.

Referring back to FIG. 5, synthetic jet 100 includes one or more actuators, micromechanical devices, or piezomotive devices 112 that are positioned on one or all surfaces 102, 104, 106, 108. Inner surface 102, outer surface 104, and top surface 106 are all shown as having actuators 112 attached thereto. Further, as shown in FIG. 6 in phantom, an actuator may be positioned on the bottom surface 108 as well. In addition, although actuators 112 are illustrated as covering only a portion of the respective surfaces 102, 104, 106, embodiments of the invention include one or more actuators 112 configured to cover the entire respective surfaces 102, 104, 106, 108 on which they are placed. Actuators 112 may be activated by application of a rapidly alternating voltage that causes the actuators 112 to rapidly expand and contract and may be monomorph or bimorph devices. A control system 113 is coupled to actuators 112, and it is recognized that each actuator 112 includes a control system (not shown) for activation. Further, it is recognized that one control system 113 may be used to actuate more than one actuator 112.

In embodiments of the invention, actuators 112 may include devices other than piezoelectric motive devices such as shape-memory alloys, magnetic materials, electrostatic materials, hydraulic materials, and ultrasonic materials. Thus, in such embodiments, control system 113 is configured to activate actuators 112 in corresponding fashion. That is, for an electrostatic material, controller 113 may be configured to provide a rapidly alternating electrostatic voltage to actuators 112 in order to activate and flex surfaces 102, 104, 106, 108 to which actuators 112 are attached. Such additional materials may themselves be configured in monomorph and bimorph arrangements.

The one or more orifices 114 illustrated as positioned within surfaces 102, 104, 106, and 108 may be positioned in order to direct fluid emitting therefrom at one or more objects positioned proximate the synthetic jet 100. Thus, FIG. 5 illustrates a synthetic jet 100 configured to encircle, or surround, a number of elements, objects, or components 120. Encircled components 120 may include active or passive electrical components, as examples, such as resistors, capacitors, transistors, and the like, that may be positioned on, for instance, a circuit board (not shown), that could benefit from cooling air being directed thereto via the orifices 114. In one embodiment, a single component 120 is encircled by the jet 100 and includes, as an example, a single non-planar heated component that is cooled uniformly and circumferentially by a plurality of orifices 114 positioned in surface or wall 102. Encircled components 120 may also include non-electrical components such as screw heads, bolt heads, or other components. Orifices 114 positioned on the outer wall may be directed, likewise, toward components 122 that are not encircled by synthetic jet 100. The components 122 may include electrical or non-electrical components as well.

As such, synthetic jet 100 may include a number of orifices 114 positioned therein and configured to direct fluid toward components 120, 122 for the purposes of cooling. Further, synthetic jet 100 may be configured and positioned in a manner such as to avoid obstructions. In one embodiment, encircled components 120 include non-electrical components such as mounting screws for an electronics board. In such an embodiment, because the encircled non-electrical components 120 may not, in this embodiment, benefit from coolant directed thereto, then having orifices 114 that are positioned on the inner surface 102 may be foregone. As such, in this embodiment, orifices 114 may be positioned only on the external surface 104 of synthetic jet and may be positioned such that fluid emitting therefrom is directed toward components that may benefit from enhanced convective cooling.

Conversely, in an embodiment where encircled components 120 include electrical or other components that may benefit from fluid being directed thereto, external components 122 may include non-electrical components. In such an embodiment, orifices 114 positioned on the outer wall 104 may be foregone, as, in this embodiment, the external non-electrical components 122 may not benefit from coolant directed thereto.

Additionally, embodiments of this invention include orifices 114 that may be positioned, as illustrated, in the inner surface 102, the outer surface 104, the top surface 106, and the bottom surface 108 (shown in phantom). Thus, the orifices 114 may be positioned in any configuration in order to selectively direct fluid toward components, such as components 120, 122, in order to enhance convective cooling thereof. And, as illustrated, the orifices 114 may be positioned in respective walls 102, 104, or may be configured to pass through surfaces 106, 108. Orifices may also be configured to pass through actuators 112, as well, in embodiments of the invention.

Further, although the synthetic jet 100 of FIG. 5 is illustrated having a toroid shape, the invention described herein is not limited thereto. One skilled in the art will recognize that the synthetic jet 100 is not limited to standard geometric configurations (i.e. a toroid, oval, etc. . . . ) but may be shaped as an oval, a square, a rectangle, an ellipse, and the like, depending on the application, and orifices 114 may be positioned accordingly, depending on the convective cooling and placement requirements of the application.

Figure 7:
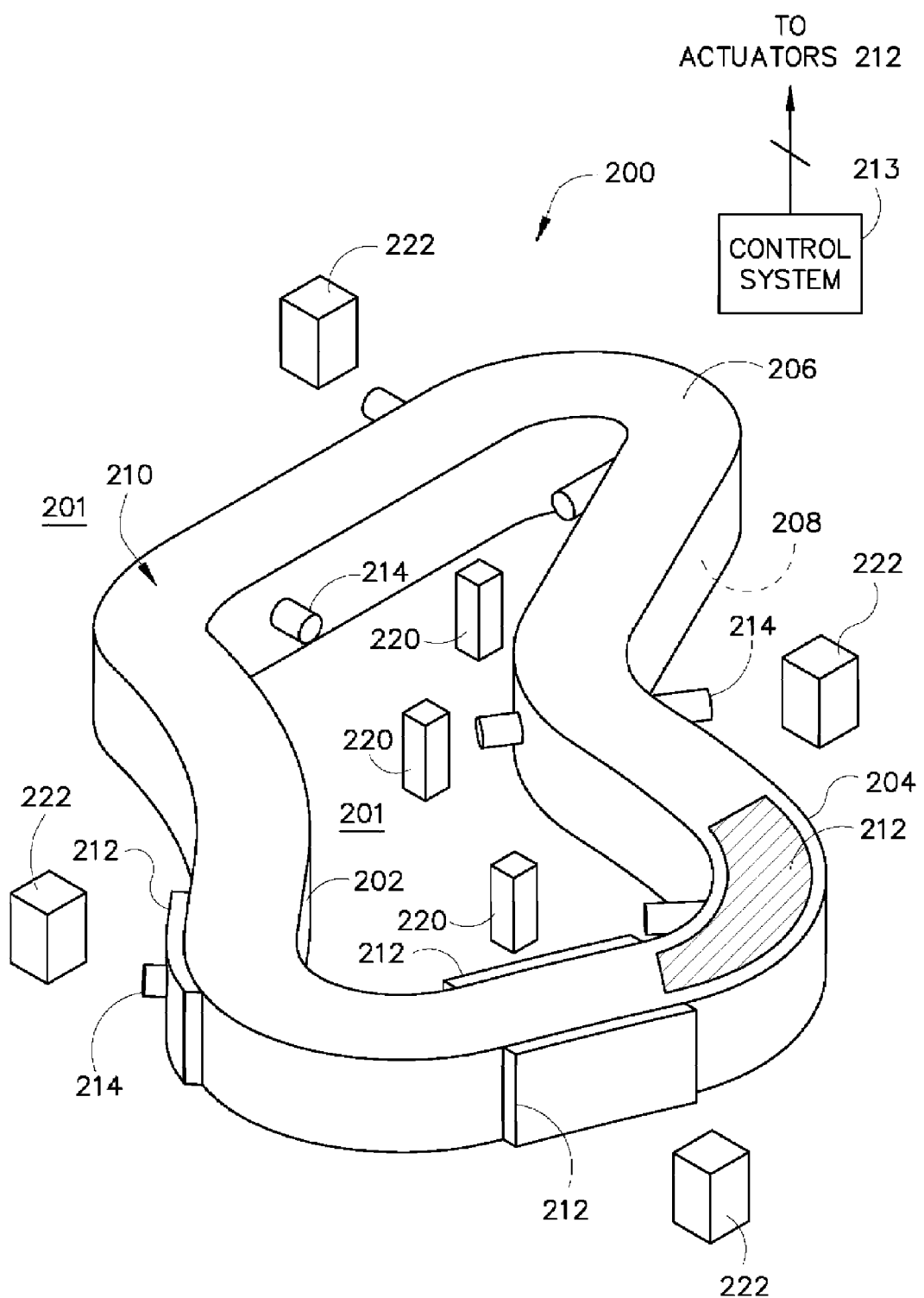
FIG. 7 is a top plan view of a synthetic jet according to another embodiment of the invention.

Thus, referring now to FIG. 7, irregularly shaped synthetic jet 200 includes an inner wall 202, an outer wall 204, a top surface 206, and a bottom surface 208 that are configured to form volume, enclosure or cavity 210. Jet 200 includes micromechanical devices or actuators 212 coupled to the walls 202, 204 and surfaces 206, 208 and controlled by controllers 213. The walls 202, 204 are configured to have continuous, unbroken surfaces that form boundaries between the jet 200 and the environment 201 external to the jet 200.

Further, as in the embodiments described with respect to FIG. 5, actuators 212 may be configured over limited portions or over the entire surfaces of walls 202, 204 and surfaces 206, 208. Likewise, actuators 212 may include piezomotive devices, which may include monomorph or bimorph devices, and actuators 212 may include devices other than piezoelectric motive devices, such as shape-memory alloys, magnetic materials, electrostatic materials, and ultrasonic materials.

Thus, in such embodiments, control systems 213 are configured to activate actuators 212 in corresponding fashion. That is, for an electrostatic material, controllers 213 may be configured to provide a rapidly alternating electrostatic voltage to actuators 212 in order to activate and flex surfaces 202, 204, 206, 208. Such additional materials may themselves be configured in monomorph and bimorph arrangements.

The irregularly-shaped synthetic jet 200 includes one or more orifices 214 illustrated as positioned within walls and surfaces 202, 204, 206, and 208. Orifices 214 may be positioned in order to direct fluid emitting therefrom from volume 210 toward one or more objects positioned proximate the synthetic jet 200. Thus, FIG. 7 illustrates a synthetic jet 200 configured to encircle, or surround, a number of elements or components 220 that could benefit from cooling air directed thereto via the orifices 204, or encircled components 220 may also include non-electrical components such as screw heads, bolt heads, or other components. Orifices 214 positioned on the outer wall 204 may be directed, likewise, toward components 222 that are external to the synthetic jet 200. The external components 222 may include electrical or non-electrical components as well.

As such, synthetic jet 200 may include a number of orifices 214 positioned therein and configured to direct fluid toward components 220, 222 for the purposes of cooling. Further, synthetic jet 200 may be configured and positioned in a manner such as to avoid obstructions. However, in this embodiment, components 220, 222 may be positioned in an irregular fashion that may preclude the use of standard geometric configurations (i.e., a toroid, oval, etc.). Thus, according to this embodiment, synthetic jet 200 may be configured in an irregular shape in order to encircle components 220, which may include electrical components for cooling or obstructions that may not need cooling. The irregular shape of jet 200 may also be selected in order to position orifices 214 on the outer wall 204, as an example, in order to direct fluid toward external components 222 as well.

According to one embodiment of the invention, a synthetic jet includes an inner wall configured to surround a heat-generating component, a plurality of walls coupled to the inner wall, the inner wall and the plurality of walls configured to enclose a volume surrounding the inner wall, an actuator coupled to one of the plurality of walls and the inner wall. The inner wall has a plurality of orifices formed therein configured to direct a fluid toward the heat-generating component upon activation of the actuator.

In accordance with another embodiment of the invention, a method of fabricating a synthetic jet includes forming a synthetic jet comprising an inner wall and having an interior volume configured to encircle the inner wall, wherein the inner wall is configured to encircle an exterior volume, attaching a micromechanical device to the synthetic jet, and forming a plurality of apertures through the inner wall such that fluid passing therethrough from the interior volume is directed toward the exterior volume via activation of the micromechanical device.

Yet another embodiment of the invention includes a system for cooling a device that includes a component and a synthetic jet. The synthetic jet includes a top surface having an unbroken inner perimeter and an unbroken outer perimeter and a bottom surface having an unbroken inner perimeter and an unbroken outer perimeter. The synthetic jet also includes an inner wall coupled to the inner perimeter of the top surface and the inner perimeter of the bottom surface, the inner wall configured to encircle the component, and an outer wall coupled to the outer perimeter of the top surface and the outer perimeter of the bottom surface, and configured to form an enclosure between the top surface, the bottom surface, the inner wall, and the outer wall. An actuator is coupled to one of the walls and surfaces and configured to vary an internal volume of the enclosure. One of the walls and surfaces has at least one orifice formed therethrough, the at least one orifice fluidically coupled to the enclosure and fluidically coupled to an environment external to the enclosure. The at least one orifice is positioned to direct fluid passing therethrough toward the component.

The invention has been described in terms of the preferred embodiment, and it is recognized that equivalents, alternatives, and modifications, aside from those expressly stated, are possible and within the scope of the appending claims.

What is claimed is:

1. A synthetic jet comprising:
    an inner wall configured to surround a heat-generating component;
    a plurality of walls coupled to the inner wall, the inner wall and the plurality of walls configured to enclose a volume surrounding the inner wall; and
    an actuator coupled to one of the plurality of walls and the inner wall;
    wherein the inner wall has a plurality of orifices formed therein configured to direct a fluid toward the heat-generating component upon activation of the actuator.

2. The synthetic jet of claim 1 wherein the plurality of walls comprises a top wall and a bottom wall.

3. The synthetic jet of claim 2 wherein one of the top and bottom walls has an orifice formed therein, the orifice positioned to direct fluid passing therethrough toward a component to be cooled.

4. The synthetic jet of claim 2 wherein the plurality of walls comprises an outer wall coupled to the top and bottom walls, the outer wall surrounding the inner wall.

5. The synthetic jet of claim 4 wherein the outer wall has an orifice formed therein, the orifice positioned to direct fluid passing therethrough toward a component to be cooled.

6. The synthetic jet of claim 1 wherein a shape of the inner wall surrounding the heat-generating component is one of a circular shape, a square shape, a rectangular shape, an elliptical shape, and an irregular geometric shape.

7. The synthetic jet of claim 1 wherein the actuator comprises one of a monomorph piezoelectric motive device and a bimorph piezoelectric motive device.

8. The synthetic jet of claim 1 wherein the actuator comprises one of a shape-memory alloy, a magnetic material, an electrostatic material, a hydraulic material, and an ultrasonic material.

9. A method of fabricating a synthetic jet comprising:
    forming a synthetic jet comprising an inner wall and having an interior volume configured to encircle the inner wall, wherein the inner wall is configured to encircle an exterior volume;
    attaching a micromechanical device to the synthetic jet; and
    forming a plurality of apertures through the inner wall such that fluid passing therethrough from the interior volume is directed toward the exterior volume via activation of the micromechanical device.

10. The method of claim 9 wherein forming the synthetic jet comprises coupling a plurality of walls to the inner wall to surround the interior volume.

11. The method of claim 10 wherein coupling a plurality of walls to the inner wall comprises forming a toroid enclosure.

12. The method of claim 9 wherein attaching the micromechanical device comprises attaching one of a monomorph piezoelectric device and a bimorph piezoelectric device.

13. The method of claim 9 wherein attaching the micromechanical device comprises attaching one of a shape-memory alloy, a magnetic material, an electrostatic material, and an ultrasonic material.

14. A system for cooling a device comprising:
a component; and
a synthetic jet comprising:
  a top surface having an unbroken inner perimeter and an unbroken outer perimeter;
  a bottom surface having an unbroken inner perimeter and an unbroken outer perimeter;
  an inner wall coupled to the inner perimeter of the top surface and the inner perimeter of the bottom surface, the inner wall configured to encircle the component;
  an outer wall coupled to the outer perimeter of the top surface and the outer perimeter of the bottom surface, wherein the top surface, the bottom surface, the inner wall, and the outer wall form an enclosure; and
  an actuator coupled to the enclosure and configured to vary an internal volume of the enclosure;
  wherein the inner wall has a pair of orifices formed therethrough and fluidically coupled to the internal volume and fluidically coupled to an environment external to the enclosure, wherein the pair of orifices is positioned to direct fluid passing therethrough toward the component.

15. The system of claim 14 wherein the component is an electrical component that generates heat.

16. The system of claim 14 wherein the component is a passive, non-electrical component.

17. The system of claim 14 wherein the synthetic jet has one of a toroid shape, a square shape, a rectangle shape, an ellipse shape, and an irregular shape.

18. The system of claim 14 wherein the actuator is one of a monomorph piezoelectric device and a bimorph piezoelectric device.

19. The system of claim 14 wherein the actuator is one of a shape-memory alloy, a magnetic material, an electrostatic material, a hydraulic material, and an ultrasonic material.

20. The system of claim 14 wherein the top and bottom surfaces have substantially the same shape.

* * * * *